United States Patent [19]
Terasawa

[11] Patent Number: 5,942,797
[45] Date of Patent: Aug. 24, 1999

[54] POWER SEMICONDUCTOR MODULE

[75] Inventor: Noriho Terasawa, Kanagawa, Japan

[73] Assignee: Fuji Electric Co. Ltd., Kanagawa, Japan

[21] Appl. No.: 08/824,390

[22] Filed: Mar. 26, 1997

[30]   Foreign Application Priority Data

Apr. 2, 1996   [JP]   Japan ..................................... 8-079748

[51] Int. Cl.$^6$ .................................................. H01L 23/34
[52] U.S. Cl. .......................... 257/723; 257/712; 257/729; 257/925; 257/703
[58] Field of Search .................................... 257/723, 724, 257/725, 712, 729, 925, 703, 678

[56]   References Cited

U.S. PATENT DOCUMENTS

| | | | |
|---|---|---|---|
| 4,278,985 | 7/1981 | Stobbs | 257/909 |
| 4,604,643 | 8/1986 | Yotsumoto et al. | 257/909 |
| 4,670,771 | 6/1987 | Neidig et al. | 257/909 |
| 5,391,919 | 2/1995 | Torti et al. | 257/925 |
| 5,512,782 | 4/1996 | Kobayashi | 257/925 |
| 5,576,575 | 11/1996 | Terasawa | 257/503 |

FOREIGN PATENT DOCUMENTS

6-101636  of 0000  Japan .
4-211200  8/1992  Japan .

*Primary Examiner*—Olik Chaudhuri
*Assistant Examiner*—Nathan K. Kelley
*Attorney, Agent, or Firm*—Pearne, Gordon, McCoy & Granger LLP

[57]   ABSTRACT

A power semiconductor module in which a plurality of power semiconductor elements forming a bridge circuit are provided together with control circuits. The module includes a common casing which accommodates a metal base, a main circuit section, and a control circuit section. The main circuit section has a plurality of semiconductor elements of the bridge circuit mounted on a ceramic insulating board which is thermally coupled to the metal base. The main circuit section also supports connecting conductors to which the semiconductor elements are connected. In the control circuit section are mounted control circuits for the semiconductor elements. The control circuits are mounted on a wiring substrate which is formed by wiring conductors on an insulating board. The main circuit section is connected through a bond to the control circuit section. Input and output terminals of the bridge circuit are extended from the connecting conductors of the main circuit section. Connecting terminals of the control circuits, which are to connected to external equipment, extend from the wiring conductors.

24 Claims, 5 Drawing Sheets

POWER SEMICONDUCTOR MODULE

BACKGROUND OF THE INVENTION

This invention relates to a semiconductor module for power (hereinafter referred to as "a power semiconductor module", when applicable) which is formed by assembling power semiconductor elements such as a plurality of insulated gate bipolar transistors (hereinafter referred to as "IGBTs", when applicable) forming a bridge circuit employed for a power inverter device or the like in a common casing together with its control circuit.

Figure 7:
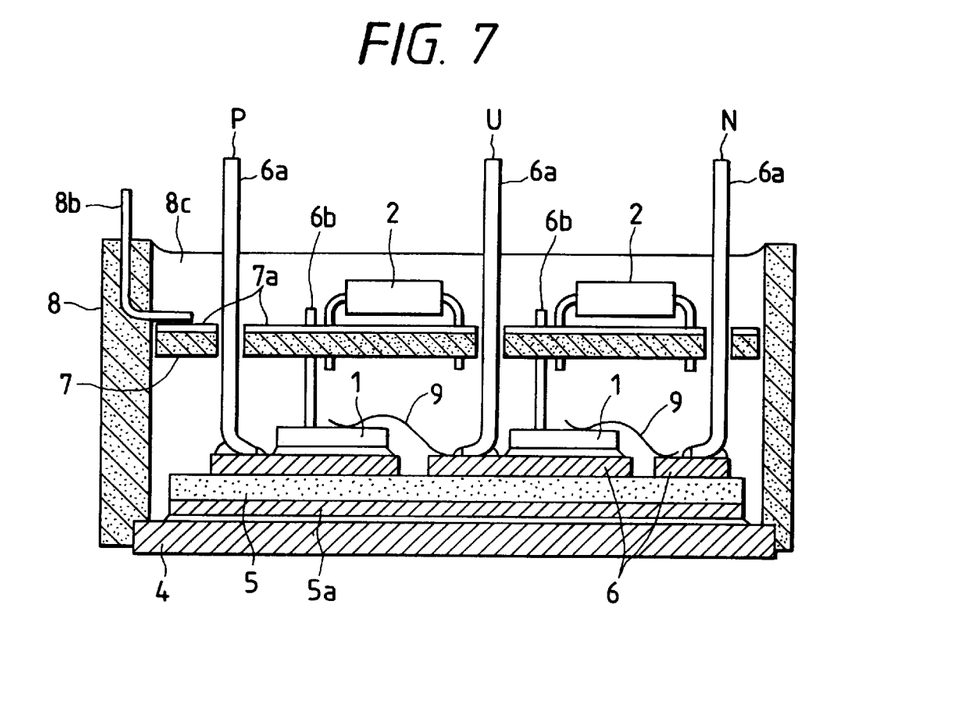
FIG. 7 is a sectional view showing an example of a conventional power semiconductor module.
Figure 8:
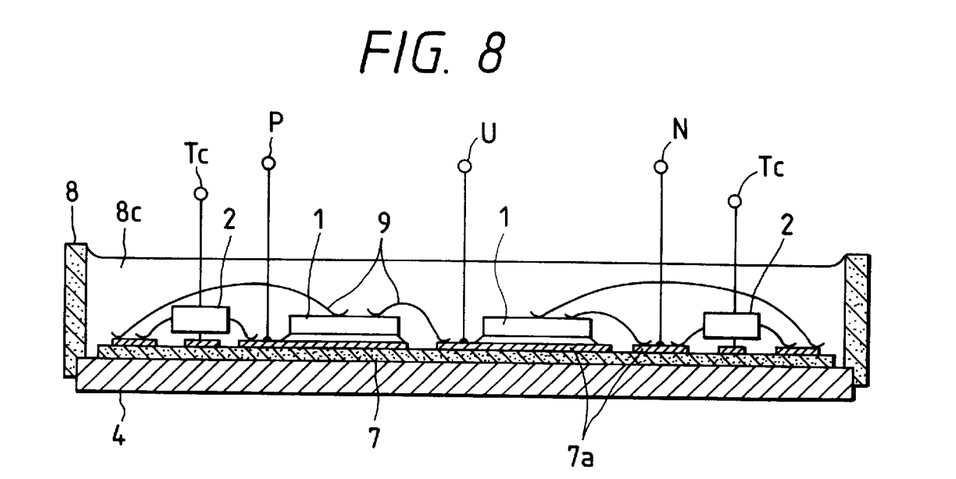
FIG. 8 is a sectional view showing another example of the conventional power semiconductor module.

A conventional power semiconductor module of this type is designed as follows: For the purpose of reduction both in size and in manufacturing cost, the semiconductor elements are not accommodated in the respective packages, and instead the semiconductor elements which are provided in the form of chips are assembled as they are. Furthermore, in order to provide a so-called "intelligent module" with them which is convenient in practical use, they are set in a common casing together with a control circuit including a semiconductor element drive circuit, and then resin is injected into the casing. Hence, the structure of the power semiconductor module thus formed is rigid. FIGS. 7 and 8 are sectional views showing examples of the structure of the above-described conventional semiconductor module.

FIG. 7 shows two semiconductor elements 1 and two element control circuits 2 which correspond to one phase of a three-phase bridge circuit. The left half of FIG. 7 is for a description of the upper arm side which has the positive input terminal P of the bridge circuit, and the right half is for a description of the lower arm side having the negative input terminal N. The U-phase output terminal U is shown at the middle of FIG. 7. The bottom of the module is made of a metal substrate 4 of copper on which a heat-sink (not shown) is mounted. Onto the substrate 4, a ceramic board 5 is soldered through its metallized layer 5a.

A plurality of connecting conductors 6, which are arranged in a predetermined pattern, are supported on the upper surface of the ceramic board 5. The semiconductor elements 1 are each soldered, in the form of a chip, to the connecting conductors 6. The semiconductor elements 1 are connected to the connecting conductors 6 adjacent thereto with bonding wires as shown in FIG. 7, and terminal plates 6a of copper are fixedly mounted on the upper surfaces of the connecting conductors 6, for instance, by soldering in such a manner that they are extended vertical, thus being employed as the input terminals P and N and the output terminal U.

Each of the element control circuits 2 is an integrated circuit device which includes a drive circuit and a protective circuit for the respective semiconductor element 1, and it is mounted on a wiring substrate 7, which is a so-called "printed circuit board", with its leads soldered thereto through wiring conductors 7a of copper. For each of the semiconductor element 1, a plurality of bar-shaped copper supports 6b are extended upwardly from the connecting conductor 6 which is bonded to the element 1 in the rear region. The upper portions of those supports are soldered to the wiring conductors 7a of the wiring substrate 7, so that the element control circuit 2 is connected to the semiconductor element 1, and the wiring substrate 7 is supported on the bottom of the module. A plastic casing 8 is in the form of a rectangular hollow quadrangular prism. The lower edge of the plastic casing 8 is engaged with the periphery of the metal substrate 4, and the lower ends of a plurality of terminal bars 8b secured to the upper edge portion of the plastic casing 8 are suitably connected to the wiring conductors 7a of the wiring substrate 7, thus being employed as external connecting terminals for control signals. Under this condition, epoxy resin is injected into the casing 8 and then solidified, so that all components are provided as one unit. Hence, the resultant module is high in rigidity.

FIG. 8 shows an example of the structure of a module suitable for small electric power in the same manner as FIG. 7. In FIG. 8, parts corresponding functionally to those already described with reference to FIG. 7 are therefore designated by the same reference numerals or characters. Two semiconductor elements 1, which are each in the form of a chip, are fixedly mounted as they are by soldering the wiring conductors 7a of a wiring substrate 7 which is fixedly mounted on the upper surface of a metal substrate 4, for instance, by bonding. And two integrated circuit devices for two element control circuits 2 are also mounted on the right and left sides of the aforementioned wiring substrate 7.

The semiconductors, which are each in the form of a chip, are suitably connected to the wiring conductors 7a with bonding wires 9 as shown in FIG. 8. A positive input terminal P, a negative input terminal N, and an output terminal U are extended from the middle region where the element control circuits 2 are mounted, and control terminals Tc are extended from the right and left regions where the element control circuits 2 are mounted. Similarly as in the module shown in FIG. 7, the metal substrate 4 is fitted, as a bottom, in the casing 8, and resin 8c is injected into the casing 8 thus bottomed, and solidified, so that all elements are provided as one unit. That is, the resultant module thus formed is relatively flat, being smaller in height than the one shown in FIG. 8.

In the above-described prior art to FIG. 7, the ceramic board 5 and the wiring substrate 7, which bear the semiconductor elements 1 and the element control circuits 2, are arranged one above another, thus forming a so-called "two-storied structure". Hence, the resultant module is relatively small in its occupied area; however, it is disadvantageous in that its assembling work takes time and labor, and accordingly it is high in manufacturing cost. The reason why the assembling work takes time and labor so much resides in that the ceramic board 5 and the wiring substrates arranged one above another are coupled to each other through the connecting supports 6b, and that at least three to five supporting supports 6b are required for each semiconductor element 1, and, during the assembling work, the end portions of those supporting supports 6b are accurately positioned at the through-holes formed in the wiring board 7 and fitted in them (the through-holes). In addition, since a number of connecting supports 6b must be erected on the ceramic board 5, the latter 5 needs an additional area for the erection. Therefore, although the module employs the two-storied structure, it is impossible to sufficiently reduce the area occupied by the module.

The module shown in FIG. 8 is free from the above-described difficulties accompanying the one shown in FIG. 7; however it is still disadvantageous in that it is not suitable for high power because the wiring substrate 7 is considerably high in thermal resistance; that is, the semiconductor element 1 is low in thermal radiation efficiency. Since the wiring substrate 7 has no through-holes, the module is not suitable for the installation of the integrated circuit devices for the element control circuits 2.

SUMMARY OF THE INVENTION

Accordingly, an object of the invention is to eliminate the above-described difficulties accompanying a conventional power semiconductor module. More specifically, an object of the invention is to provide a power semiconductor module which is suitable for high power, and can be assembled with ease, and is accordingly low in manufacturing cost.

The foregoing object of the invention has been achieved by the provision of a power semiconductor module in which, according to the invention, a common casing accommodates;
   a metal base,
   a main circuit section in which power semiconductor elements are mounted, in the form of chips, on a ceramic insulating board which is thermally coupled to the metal base, and
   a control circuit section in which control circuits for the semiconductor elements are mounted on a wiring substrate which is formed by bearing wiring conductors on an insulating board,
      the main circuit section being connected through bonding means to the control circuit section, and
input and output terminals of the bridge circuit are extended from the connecting conductors of the main circuit section, and
connecting terminals of the control circuits which are to be connected to external equipment are extended from the wiring conductors.

As is apparent from the above description, in the power semiconductor module, (a) the connecting conductors are supported on the ceramic insulating board high in thermal conductivity which is thermally coupled to the metal base, and the semiconductor elements are mounted, in the form of chips, thereon, so that the heat radiation to the metal base side is improved; that is, the resultant module is suitable for high power, (b) the large current input and output terminals are readily extended from the connecting conductor of the main circuit section, which simplifies the assembling work of the module as much, (c) the integrated circuit devices for low power control circuits are mounted on the wiring substrate, and the wiring conductors are formed as a minute pattern, whereby the control circuit section is reduced in area as much, and (d) the control circuit section is connected through the bonding means to the main circuit section, whereby the internal wiring work is simplified or automated to reduce the manufacturing cost.

In general, each of the above-described semiconductor elements comprises: a switching element for switching on and off current in the respective arm in the bridge circuit, and a free wheeling diode which is anti-parallel-connected to the switching element. It is desirable that the switching element and the diode are provided as one chip. In the case where they are provided as separate chips, it is preferable that they are set adjacent to each other.

In the power semiconductor module, from the view point of manufacture it is preferable that thin metal plates such as thin copper plates are bonded to both surfaces of the ceramic insulating board in the main circuit section, and then the metal plate on one of the surfaces of the ceramic insulating board are welded to the metal base, for instance, by soldering, while the metal plate on the other surface of the ceramic insulating board is formed into the connecting conductors by patterning. In addition, an elongated metal plate of copper or the like is employed for the provision of the input and output terminals of the main circuit section and the module itself. In this case, it is preferable that one end portion of the metal plate is connected to the connecting conductor of the main control circuit section, and the other end portion are formed into the terminals.

It is preferable that the element control circuits corresponding to the semiconductor elements, and a microprocessor for controlling the whole bridge circuit are assembled, as a bridge control circuit, in the module. In this case, it is advantageous that the element control circuits are provided on both sides of the main circuit section. Similarly as in the case of the semiconductor elements, it is desirable that the element control circuits are mounted, in the form of chips, on the wiring substrates. Furthermore, in order to connect it to the bridge control circuit, a multi-layer type wiring substrate is employed; that is, switching commands and abnormal signals such as over-current signals are transmitted between the bridge control circuit and the element control circuit through the wiring conductors buried in the multi-layer type wiring substrate. This feature contributes to the decrease in area of the control circuit section, and minimizes the interference of signals.

It is essential that the element control circuit operates on the same reference potential as the corresponding semiconductor element, and the operational interference between a plurality of element control circuits is minimized. For this purpose, it is preferable that the wiring substrate in the control circuit section is a multi-layer type wiring substrate, and the lowest layer thereof is employed as a shield conductor layer for the element control circuits, to provide the operational reference potential, thereby to eliminate the erroneous operation of the element control circuit. In the case where the element control circuit is mounted as a chip, in order to transmit signals between the element control circuit and the semiconductor element chip it is preferable that the two chips are connected through bonding means.

DETAILED DESCRIPTION OF THE PREFERRED EMBODIMENTS

Preferred embodiments of the invention will be described with reference to the accompanying drawings.

Figure 1:
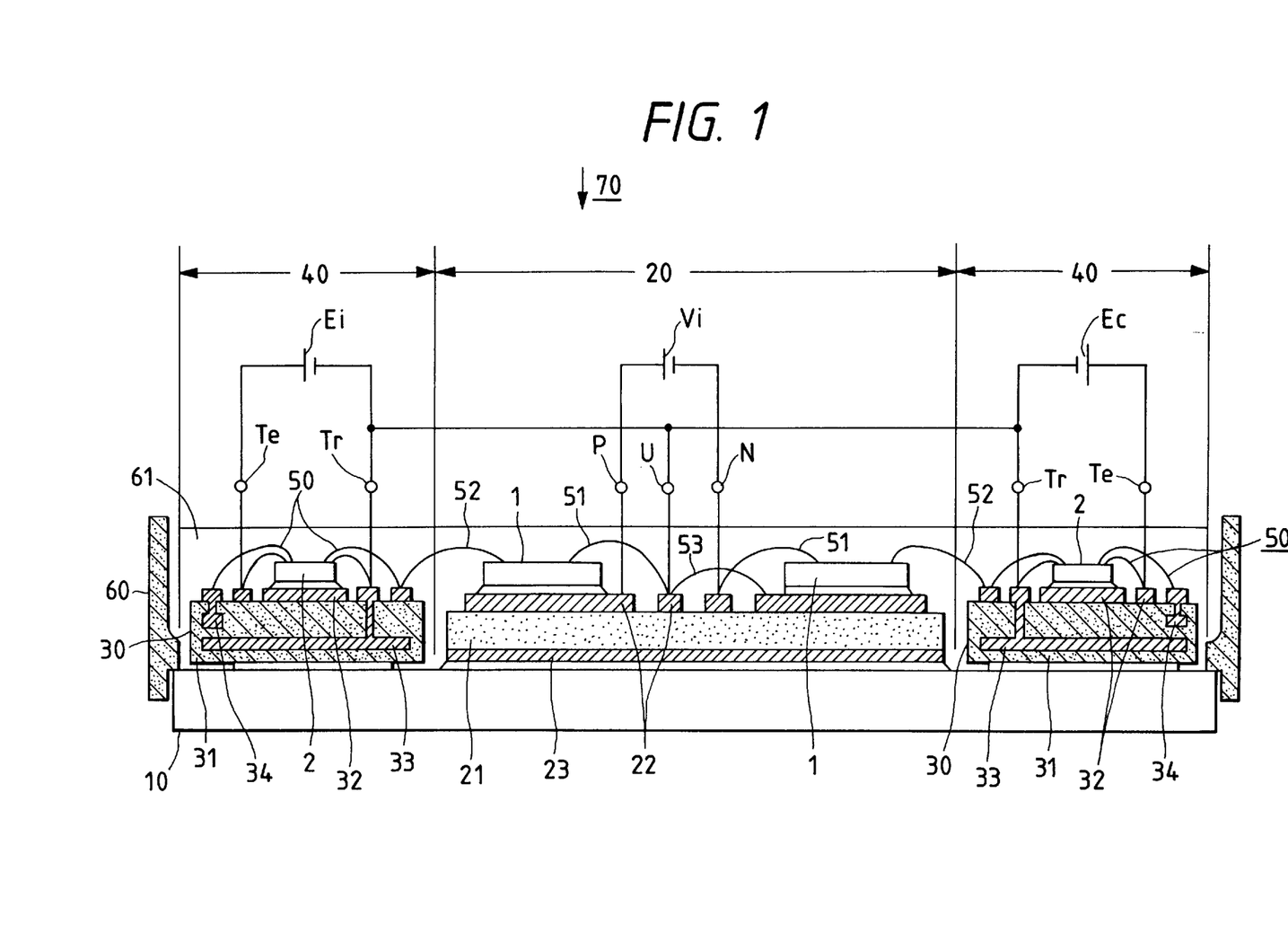
FIG. 1 is a sectional view showing an example of a power semiconductor module according to the invention.
Figure 2:
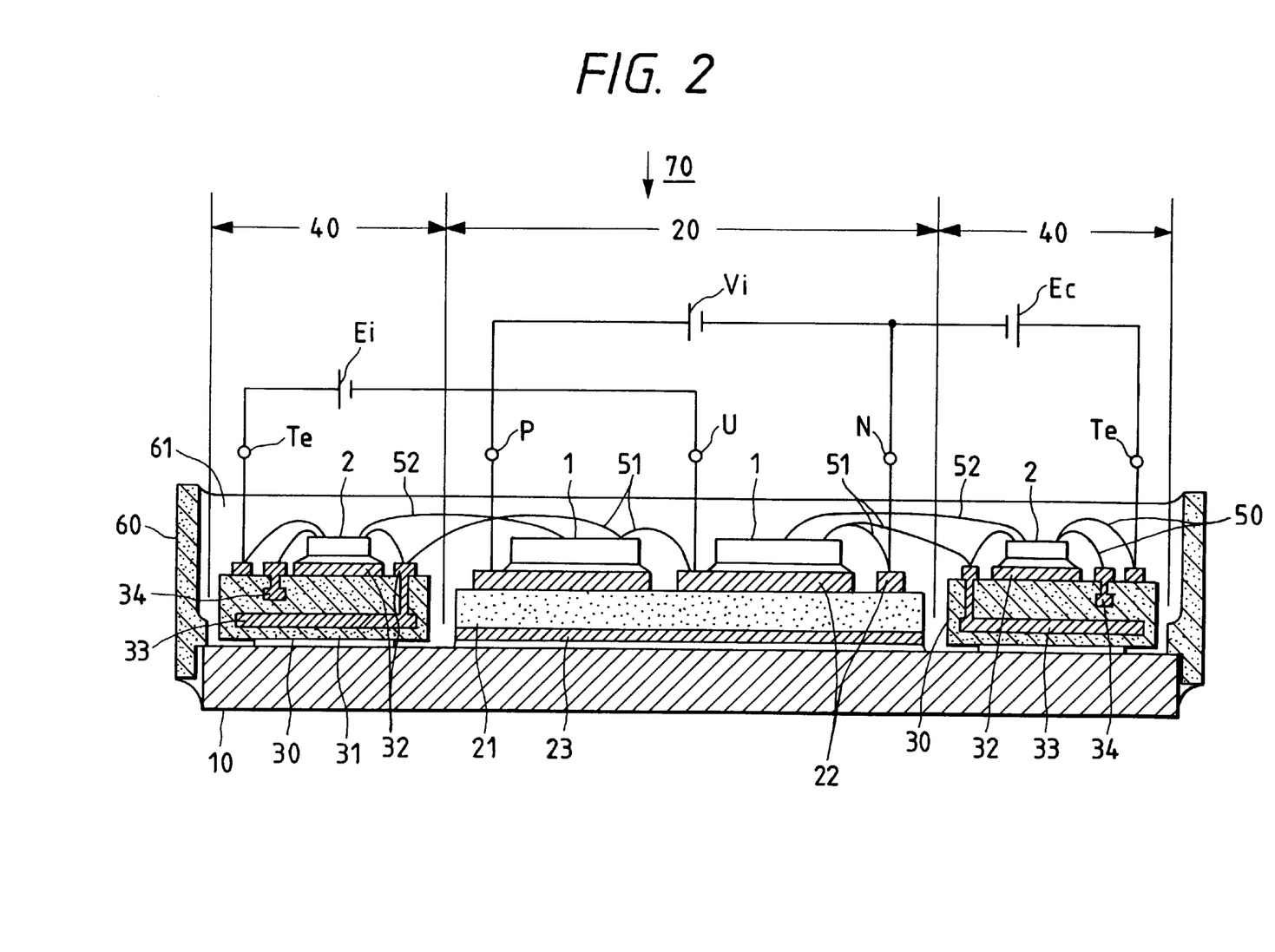
FIG. 2 is a sectional view showing another example of the power semiconductor module according to the invention.
Figure 3:
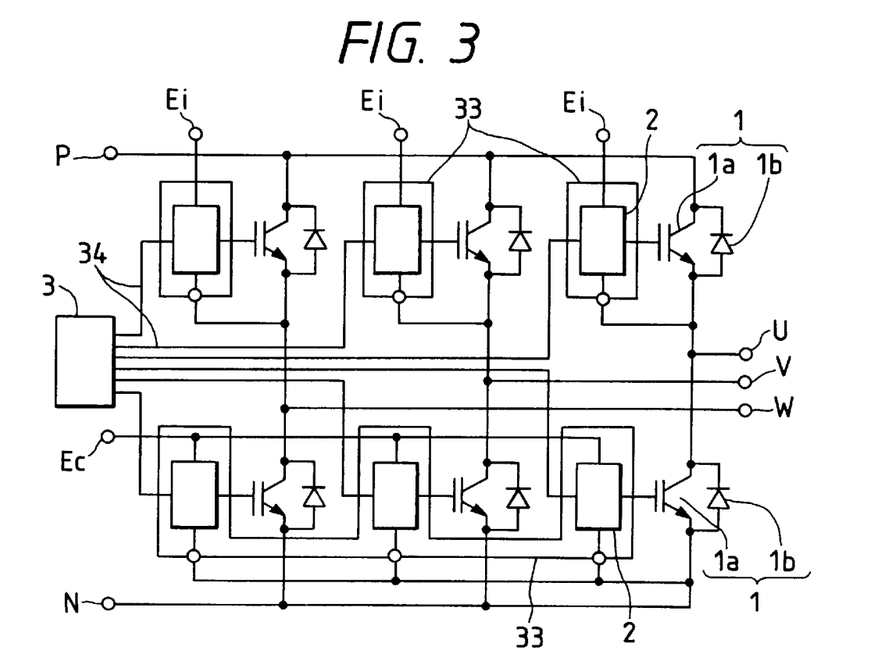
FIG. 3 is a circuit diagram showing an example of a bridge circuit which corresponds to the modules shown in FIGS. 1 and 2.
Figure 4:
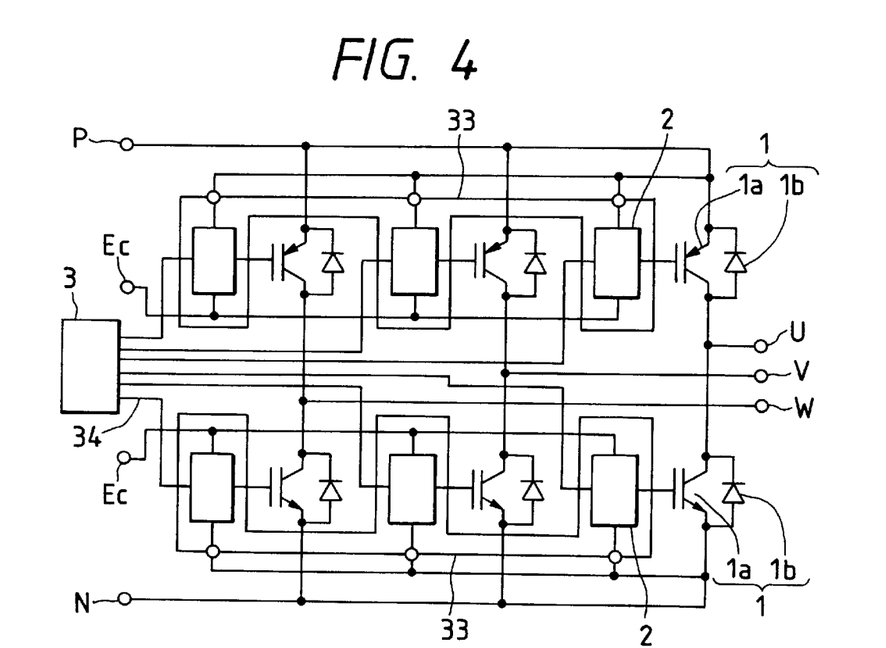
FIG. 4 is a circuit diagram showing another example of the bridge circuit.
Figure 5:
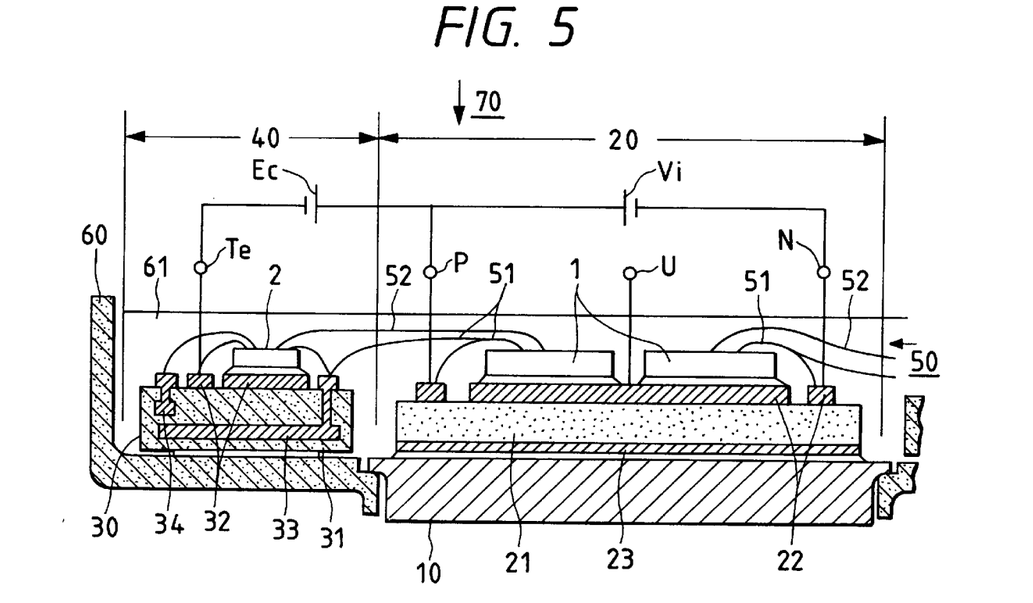
FIG. 5 is a sectional view showing a power semiconductor module corresponding to the circuit shown in FIG. 4.
Figure 6:
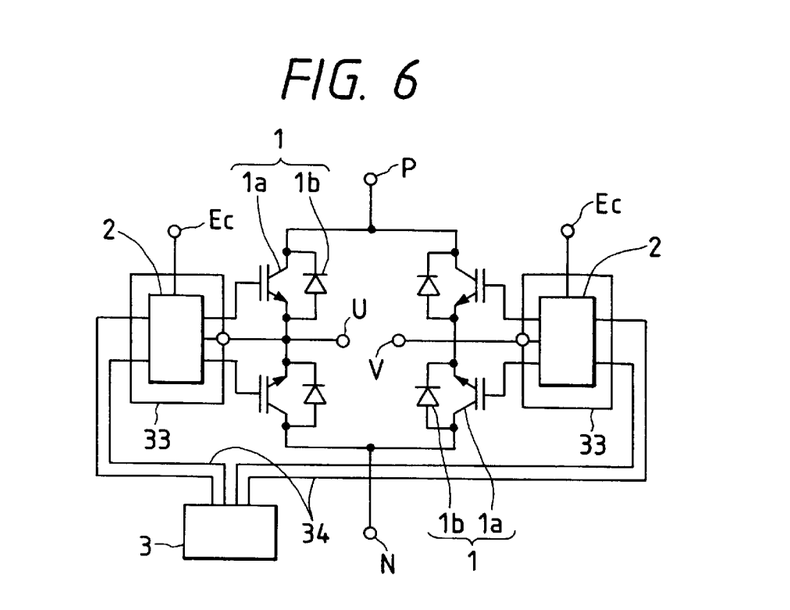
FIG. 6 is a circuit diagram showing another example of the bridge circuit.

FIG. 1 is a sectional view showing an example of a power semiconductor module according to the invention. FIG. 2 is a sectional view showing another example of the power semiconductor module according to the invention. FIG. 3 is a circuit diagram showing an example of a bridge circuit. FIG. 4 is a circuit diagram showing another example of the bridge circuit. FIG. 5 is a sectional view showing part of a power semiconductor module which corresponds to the circuit of FIG. 4. FIG. 6 is a circuit diagram showing another example of the bridge circuit. The module structures of FIGS. 1 and 2 correspond to the circuit of FIG. 3.

As conducive to a full understanding of the invention, first the bridge circuit of FIG. 3 will be described.

The bridge circuit shown in FIG. 3 is a three-phase bridge circuit, which is for instance a power inverter device which receives a DC power voltage across a pair of positive and negative terminals P and N, to drive three-phase load applied to an electric motor or the like which are connected to three output terminals U, V and W. The three-phase bridge circuit includes six (6) power semiconductor elements 1, six (6) element control circuits 2 in correspondence to the former 1, and one bridge control circuit 3. Each of the semiconductor elements 1 is a compound element which consists of a switching element 1a which is an IGBT, and a free wheeling diode 1b connected in parallel to the switching element 1a. Each of the element control circuits 2 is an integrated circuit device which includes a drive circuit and protective circuit for the respective semiconductor element 1. The bridge control circuit 3 is an integrated circuit device including a micro-processor which controls the whole bridge circuit. Between those circuits, a switching command for specifying the "on" or "off" state of the semiconductor element 1 and an over-current state thereof are transmitted over to each other. In order to operate the element control circuits 2 on the same potential as the semiconductor elements 1, the element control circuits 2 are connected to the emitter sides of the switching elements 1a, respectively, and receive control power voltages Ei on the upper arm side, and a common power voltage Ec on the lower arm side.

FIG. 1 shows the structure of the semiconductor module 70; more specifically, FIG. 1 shows the upper and lower arms of the U-phase—the left half shows the upper arm side, and the right half shows the lower arm side. A metal base 10, which is a flat plate of copper, forms the bottom of the semiconductor module 70, and it is coupled to a heat sink (not shown). The middle part of FIG. 1 corresponds to a main circuit section 20 which is formed as follows: Connecting conductors 22 are supported on a ceramic insulating board 21 which is thermally coupled to the metal base 10, and the semiconductor elements 1, which are each in the form of a chip, are mounted on the connecting conductor 22 normally by soldering. Each semiconductor element 1 may be provided in the form of one chip by combining the switching element and the diode with each other as shown in FIG. 3. However, normally, they are provided as separate chips, and are arranged on the same connecting conductor in such a manner that they are adjacent to each other, and connected to each other by bonding. The corrector side of the switching element is soldered to the connecting conductor 22.

The main circuit section 20 as described above may be formed as follows: A so-called "direct bonded copper structure" whose both sides are copper plates joined together is employed as the ceramic insulating board 21, and the upper copper plate is patterned into a plurality of connecting conductors 22 by photo-etching. Thereafter, the semiconductor elements 1, which are each provided in the form of a chip, are mounted on the connecting conductors 22. The lower copper plate 23 is soldered to the metal base 10. This method facilitates the assembling work.

In FIG. 1, on the left side, one connecting conductor 22 is provided for the three semiconductors 1, and a positive input terminal P is extended from the connecting conductor 22. On the right side, a plurality of connecting conductors are provided respectively for the semiconductor elements 1 on the lower arm side. The semiconductor elements 1 are mounted on the connecting conductors, respectively, and the emitter of each of the semiconductor elements are connected through a bonding wire to the connecting conductor 22 on the left side thereof, and a negative input terminal N is extended from the connecting conductor. The semiconductor elements 1 on the upper arm side are connected through emitter bonding wires 51 to the connecting conductors 22 on the right side thereof, and an output terminal U is extended therefrom; and then connected through bonding wires 53 to the connecting conductors 22 used for the mounting of the semiconductor elements 1 on the lower arm side. The input terminals P and N and the output terminal U may be provided as follows: The lower ends of elongated copper plates are soldered to the connecting conductors, and the upper ends are utilized as those terminals.

Each control circuit section 40 comprises the element control circuits 2 shown in FIG. 3, and the bridge control circuit 3 when necessary. The element control circuits 2 (only two shown in FIG. 1) which correspond to the semiconductor elements 1 of the upper and lower arms, are suitably mounted on both sides of the main circuit section 20. It is rational that the mounting section of the bridge control circuit 3 and the connecting terminal sections of the control circuit sections 40 which are to be connected to external equipment are collected on one side of FIG. 1 as viewed in the front-to-right direction.

The wiring substrate 30 may be a so-called "printed circuit board" which is made up of an insulating board 31 and wiring conductors 32 printed on the latter 31. However, in the invention, it is preferable that the wiring substrate 30 is a multi-layer type wiring board as shown. In the embodiment, the lowermost layer conductor of the of multi-layer type wiring substrate 30 is employed as a shield conductor for the element control circuits 2. In FIG. 3, the ranges where the shield conductors 33 should be arranged are defined by thin line frames, respectively. As is seen from this fact, for the element control circuits 2 of the upper arm on the left side of FIG. 1, individual patterns are provided, respectively; while for the control circuits 2 of the lower arm on the right side of FIG. 1, a common pattern is provided. In the embodiment, the wiring substrate 30 is fixedly mounted on the metal base 10 with adhesive.

In the above-described embodiment, as shown in FIG. 1, each of the element control circuits 2, which are each in the form of a chip, is mounted, as they are, on the wiring conductors 32 by soldering which are provided on the surface of the wiring substrate 30, and the element control circuit 2 is connected to wiring conductors around it by bonding means 50. A reference potential terminal Tr and a power source terminal Te of the element control circuit 2 are extended from those wiring conductors 32. The wiring conductor 32 for the reference potential terminal Tr is connected to the aforementioned shield conductor 33 inside the wiring substrate 30, and connected to the chip of the semiconductor element 1 with a gate bonding wire 51. In the multi-layer type wiring substrate 30, a buried wiring conductor 34 is interposed between the surface layer and the lowest layer thereof so that the element control circuit 2 is connected to the aforementioned bridge control circuit 3.

After the semiconductors 1 are fixedly mounted on the ceramic insulating board while the element control circuits 2 are fixedly mounted on the wiring substrates 30, and necessary wiring is accomplished, a frame-shaped casing 60 is engaged with the metal base 10, to form a container, and epoxy resin or the like is injected thereinto and solidified. Thus, all the components are provided as one unit; that is, a semiconductor module 70 high in rigidity has been formed. The module thus formed is used as follows: As shown in FIG. 1, a bridge circuit input voltage V𝑖 is applied across the positive and negative input terminals P and N of the main circuit section 20, and on the upper arm side, control power voltages E𝑖 are applied across the terminals T𝑒 and T𝑟 of the control circuit sections 40, respectively, while on the lower arm side, a common control power voltage E𝑐 is applied across the terminals T𝑒 and T𝑟 of the control circuit sections 40.

Furthermore, on the upper arm side, the potential of the output terminal U is applied to the reference potential terminals T𝑒 of the control circuit sections 40, while on the lower arm side, the potential of the negative input terminal N is applied to the terminals T𝑒 of the section 40, so that the element control circuits 2 are operated at the same potential as the semiconductor elements 1. The shield conductors 33 receive the potentials, to shield the element control circuits 2 so that they may not erroneously operate being affected by the switching operation of the semiconductor elements 1. The element control circuits 2 and the bridge control circuit 3 operate while transmitting commands and signal to each other through the buried wiring conductors 34.

The semiconductor module 70 shown in FIG. 2 corresponds to the circuit diagram of FIG. 3; however, the mounting of the semiconductor elements 1 in the main circuit sections 1 is slightly different from that of the semiconductor elements in the main circuit section 20 in FIG. 1. That is, a positive input terminal P and an output terminal U are extended from o connecting conductors 22, respectively, to which the semiconductor elements 1 of the upper and lower arms are soldered in such a manner that they are equal in posture to each other. The emitter of each of the semiconductor elements 1 is connected through a bonding wire to the connecting conductor 22 on the right side of the element 1, and a positive input terminal N is extended from the connecting conductor 22. The control circuit sections 40 are slightly different in structure from the ones in FIG. 1. That is, the wiring conductor 31, which is equal in potential to the shield conductor 33 of the wiring substrate 30 is connected to the emitter of the respective semiconductor element 1 with the bonding wire 51, and each of the element control circuits 2 is directly (chip to chip) connected to the gate of the respective semiconductor 1 with the bonding wire 52. Only the power source terminals T𝑒 are extended from the control circuit sections 40, and individual control power voltages E𝑐 are applied across the output terminal U and the power source terminals T𝑒 on the upper arm sides, while a common control power voltage E𝑖 are applied across the negative input terminal N and the power source terminals T𝑒 on the lower arm side. In FIG. 2, parts corresponding functionally to those already described with reference to FIG. 1 are therefore designated by the same reference numerals or characters. In the module shown in FIG. 2, the number of bonding wires are somewhat larger; however, the module 7 is simplified in structure and reduced in external dimension when compared with the one shown in FIG. 1.

The lower arm side of the bridge circuit shown in FIG. 4 is the same as the lower arm side of the one shown in FIG. 3. However, the bridge circuit of FIG. 4 is different from the one of FIG. 3 in that the bipolar transistor section of IGBTs as the switching elements 1𝑎 of the semiconductor elements 1 on the upper arm side is of PNP type while the bipolar transistor section in FIG. 3 is of NPN type. Hence, the emitters of the three switching elements 1𝑎 on the upper arm side are connected to the positive input terminal P, so that the three element control circuits 2 are operated on the emitter potentials. Those element control circuits 2 are operated by a common control power voltage V𝑐, and their shield conductor 33 may be equal in pattern to the one for the element control circuits 2 on the lower arm side.

FIG. 5 is a sectional view showing the structure of an example of a semiconductor module 70 according to the circuit diagram of FIG. 4, with the lower arm side cut away. As is apparent from FIG. 4, in the corresponding semiconductor elements on the upper and lower sides, the collectors are connected to each other. Hence, in the main circuit section 20, two semiconductor elements 1 are mounted on the same connecting conductor 22 by soldering, and their emitters are connected through bonding wires 51 to connecting conductors located next to the semiconductor elements 1, and positive and negative input terminals P and N are extended from the connecting conductors, respectively, while an output terminal U is extended from the connecting conductor 22 on which the two semiconductor elements 1 has been mounted. The semiconductor module shown in FIG. 5 can be somewhat reduced in size when compared with the one shown in FIG. 2.

In FIG. 5, each control circuit 40 is substantially equal in structure to the one shown in FIG. 2, and the power source terminal T𝑒 of the respective element control circuit 2 is extended therefrom. The wiring conductor 31, which is equal in potential to the shield conductor 33 of the wiring substrate 30 is connected through a bonding wire 51 to the emitter of the corresponding semiconductor element 1, and the element control circuit 2 is connected, chip to chip, to the gate of the semiconductor element through a bonding wire 52. The shield conductor 33, being different from the one shown in FIG. 2, is formed in a pattern common with the three element control circuits 2 on the upper arm side, and only one power source terminal T𝑒 is extended from those element control circuits 2, so that a common control power voltage E𝑐 is applied to the positive input terminal P in the negative direction.

In the module structure of FIG. 5, its casing 60 is in the form of a rectangular dish. A metal base 10 is fitted in the opening formed in the bottom of the casing 60. And on the upper surface of the bottom which is located beside the metal base 10, the wiring substrate 30 of the control circuit 40 is fixed, for instance, with adhesive. In the module structure, a heat-radiating metal base is somewhat small in the effective area of thermal conduction. However, it is advantageous in that the resultant semiconductor module 70 is considerably reduced in weight.

FIG. 6 shows another example of the bridge circuit, namely, a two-phase bridge circuit. In the circuit, on the upper arm side, the bipolar transistor section of the switching element 1𝑎 of each semiconductor element 1 is of NPN type; while on the lower arm side, it is of PNP type. Output terminals U and V are extended from the connecting points of the emitters of those transistors. Because of this structure, the element control circuits 2 of both of the upper and lower arms can be operated on the potential of the output terminal U or V; that is, as is seen from FIG. 6 the element control circuits 2 of the upper and lower arms may be collected for every phase so that they are operated on the common control power voltage E𝑐. In a semiconductor module (not shown) according to the bridge circuit of FIG. 6, its control circuit section is simplified in structure, and accordingly the whole module is miniaturized.

As was described above, in the power semiconductor module of the invention, the common casing accommodates the metal base, the main circuit section in which the plurality of semiconductor elements of the bridge circuit are mounted, in the form of chips, on the ceramic insulating board which is thermally coupled tight to the metal base, and which supports the connecting conductors to which the semiconductor elements are connected, and the control circuit section in which the control circuits for the semiconductor elements are mounted on the wiring substrate which bears the wiring conductors on the insulating board, the main circuit section being connected through bonding means to the control circuit section, and the input and output terminals of the bridge circuit are extended from the connecting conductors of the main circuit section, and the connecting terminals of the control circuits which are to be connected to external equipment are extended from the wiring conductors. Hence, the module has the following effects or merits:

(a) The ceramic insulating board high in thermal conductivity which is thermally coupled tight to the metal base supports the connecting conductors, and the semiconductor elements are mounted, in the form of chips, thereon. Hence, the heat generated by the semiconductor elements is effectively radiated through the ceramic insulating board and the metal base which are both low in thermal resistance. Hence, the module suitable for high power can be formed with ease.

(b) The use of means such as copper plates makes it possible to extend the large current input and output terminals of the main circuit section from the connecting conductors supported by the ceramic insulating board. This feature simplifies the module assembling work, and accordingly decreases the module manufacturing cost.

(c) The integrated circuit devices for the low power element control circuits of the control circuit section, and the bridge control circuit are mounted on the wiring substrate. Hence, by increasing the circuit density of the integrated circuits, and by making the wiring conductor pattern of the wiring substrate minute, the wiring substrate for the control circuit section can be decreased in area. That is, the resultant module is decreased in size, and furthermore it can be decreased in manufacturing cost.

(d) The connection of the main circuit section and the control circuit section is achieved with the bonding means. Hence, the internal wiring work of the module can be accomplished readily when compared with that of the conventional module, or it is possible to automatically achieve the internal wiring work of the module. This fact greatly reduce the module assembling cost.

On the other hand, the embodiment in which the metal plates are bonded to both surfaces of the ceramic insulating board in the main circuit section, and the metal plate on one of the surfaces of the ceramic insulating board are welded to the metal base, while the metal plate on the other surface of the ceramic insulating board is formed into the connecting conductors by patterning, has the following effects or merits: That is, the connecting conductors can be readily formed in a desired pattern by photo-etching, and the joining of the ceramic insulating board with the metal base can be positively and readily achieved. Furthermore, the module in which the input and output terminals of the main circuit section are provided as one end portion of the metal plate the other end portion of which is connected to the connecting conductor, is advantageous in that large current terminals can be readily provided, and the resultant module is low in manufacturing cost.

The module in which the element control circuits in the control circuit section are arranged on both sides of the main circuit section, has the following effects or merits: That is, the two circuits sections are optimized in arrangement, the module is decreased in size, and the internal wiring work is achieved with ease, and accordingly the manufacturing cost is reduced as much. The module in which the element control circuits are mounted, in the form of chips, on the wiring substrate, is advantageous in that the area required for the mounting of the element control circuits is small, and accordingly the control circuit section is decreased in size, and the mounting work can be achieved with ease. In addition, the module in which the control circuit section includes not only the element control circuits but also the micro-processor of the bridge control circuit may include the function of controlling the whole bridge circuit device. The module thus modified is convenient in practical use and wide in the range of application.

The module in which the wiring substrate of the control circuit section is the multi-layer type wiring substrate, and the lowest layer thereof is employed as a shield conductor layer for the element control circuits, and the module in which the wiring conductor of the surface layer of the multi-layer type wiring substrate which is equal in potential to the shield conductor layer is connected through the bonding means to the semiconductor element to apply the operating potential thereto, are advantageous in that the occurrence of a trouble that the element control circuit is caused to operate erroneously by the adverse effect of the switching operation of the semiconductor element. The module in which the wiring conductors buried in the wiring substrate of multi-layer type are employed to connect the bridge control circuit to the element control circuit, is advantageous in that the erroneous operation due to the mutual signal interference is prevented, and the wiring substrate can be small in area. The module in which the chip of the semiconductor element is connected through the bonding means to the chip of the element control circuit so as to transmit signals between the chips, is advantageous in that the internal wiring in the module can be simplified.

What is claimed is:

1. A power semiconductor module in which a plurality of power semiconductor elements forming a bridge circuit are provided together with control circuits, comprising:

a common casing which accommodates;
metal base,
main circuit section in which said plurality of semiconductor elements of said bridge circuit are mounted, in the form of chips, on a ceramic insulating board which is thermally coupled to said metal base, and which supports connecting conductors to which said semiconductor elements are connected, and
a control circuit section in which said control circuits for said semiconductor elements are mounted on a wiring substrate, said wiring substrate comprising wiring conductors disposed on an insulating board, said element control circuits of said control circuit sections are arranged on both sides of said main circuit section,
wherein
said main circuit section being connected through bonding means to said control circuit section,
input and output terminals of said bridge circuit are extended from said connecting conductors of said main circuit section, and connecting terminals of said control circuits which are to be connected to external equipment are extended from said wiring conductors.

2. A power semiconductor module in which a plurality of power semiconductor elements forming a bridge circuit are provided together with control circuits, comprising:

a common casing which accommodates;
metal base,
main circuit section in which said plurality of semiconductor elements of said bridge circuit are mounted, in the form of chips, on a ceramic insulating board which is thermally coupled to said metal base, and which supports connecting conductors to which said semiconductor elements are connected, and
a control circuit section in which said control circuits for said semiconductor elements are mounted on a wiring substrate, said wiring substrate comprising wiring conductors disposed on an insulating board, said wiring substrate being a multi-layer type wiring substrate, a lowest layer of said wiring substrate being employed as a shield conductor layer for said element control circuits,
wherein
said main circuit section being connected through bonding means to said control circuit section,
input and output terminals of said bridge circuit are extended from said connecting conductors of said main circuit section, and
connecting terminals of said control circuits which are to be connected to external equipment are extended from said wiring conductors.

3. The power semiconductor module of claim 2, wherein said wiring conductor of the surface layer of said-multi-layer type wiring substrate which is connected to said shield conductor layer is connected through bonding means to a semiconductor element to apply an operating potential thereto, so that said element control circuit is operated on the same potential as said semiconductor element.

4. A power semiconductor module in which a plurality of power semiconductor elements forming a bridge circuit are provided together with control circuits, comprising:

a common casing which accommodates;
metal base,
main circuit section in which said plurality of semiconductor elements of said bridge circuit are mounted, in the form of chips, on a ceramic insulating board which is thermally coupled to said metal base, and which supports connecting conductors to which said semiconductor elements are connected, and
a control circuit section in which said control circuits for said semiconductor elements are mounted on a wiring substrate, said control circuit section includes a bridge control circuit, and a multi-layer type wiring substrate is employed as said wiring substrate, so that wiring conductors buried therein are employed to connect said bridge control circuit to said element control circuits,
wherein
said main circuit section being connected through bonding means to said control circuit section,
input and output terminals of said bridge circuit are extended from said connecting conductors of said main circuit section, and
connecting terminals of said control circuits which are to be connected to external equipment are extended from said wiring conductors.

5. The power semiconductor module of claim 1, wherein each semiconductor element comprises:
a switching element for switching on and off current in the respective arm in said bridge circuit, and
a free wheeling diode which is anti parallel-connected to said switching element.

6. The power semiconductor module of claim 1, wherein metal plates are bonded to both surfaces of said ceramic insulating board in said main circuit section, and
said metal plate on one of said surfaces of said ceramic insulating board is welded to said metal base, while said metal plate on the other surface of said ceramic insulating board is formed into said connecting conductors by patterning.

7. The power semiconductor module of claim 1, wherein said element control circuits of said control circuit section are mounted, in the form of chips, on said wiring substrate thereof.

8. The power semiconductor module of claim 1, wherein said wiring substrate in said control circuit section is a multi-layer type wiring substrate, and
the lowest layer thereof is employed as a shield conductor layer for said element control circuits.

9. The power semiconductor module of claim 8, wherein said wiring conductor of the surface layer of said multi-layer type wiring substrate which is connected to said shield conductor layer is connected through bonding means to a semiconductor element to apply an operating potential thereto, so that said element control circuit is operated on the same potential as said semiconductor element.

10. The power semiconductor module of claim 1, wherein said control circuit section includes a bridge control circuit, and
a multi-layer type wiring substrate is employed as said wiring substrate, so that wiring conductors buried therein are employed to connect said bridge control circuit to said element control circuit.

11. The power semiconductor module of claim 1, wherein each of said semiconductor element chips is connected through bonding means to a corresponding element control circuit chip, which is mounted on said wiring substrate, so as to transmit signals therebetween.

12. The power semiconductor module of claim 1, wherein input and output terminals of said module are provided as one end portion of a metal plate, the other end portion of which is connected to said connecting conductor of said main circuit section.

13. The power semiconductor module of claim 2, wherein each semiconductor element comprises:
a switching element for switching on and off current in the respective arm in said bridge circuit, and
a free wheeling diode which is anti parallel-connected to said switching element.

14. The power semiconductor module of claim 2, wherein metal plates are bonded to both surfaces of said ceramic insulating board in said main circuit section, and
said metal plate on one of said surfaces of said ceramic insulating board is welded to said metal base, while said metal plate on the other surface of said ceramic insulating board is formed into said connecting conductors by patterning.

15. The power semiconductor module of claim 2, wherein said element control circuits of said control circuit section are mounted, in the form of chips, on said wiring substrate thereof.

16. The power semiconductor module of claim 2, wherein each of said semiconductor element chips is connected through bonding means to a corresponding element control circuit chip, which is mounted on said wiring substrate, so as to transmit signals therebetween.

17. The power semiconductor module of claim 2, wherein input and output terminals of said module are provided as one end portion of a metal plate, the other end portion of which is connected to said connecting conductor of said main circuit section.

18. The power semiconductor module of claim 4, wherein each semiconductor element comprises:
- a switching element for switching on and off current in the respective arm in said bridge circuit, and
- a free wheeling diode which is anti parallel-connected to said switching element.

19. The power semiconductor module of claim 4, wherein metal plates are bonded to both surfaces of said ceramic insulating board in said main circuit section, and
said metal plate on one of said surfaces of said ceramic insulating board is welded to said metal base, while said metal plate on the other surface of said ceramic insulating board is formed into said connecting conductors by patterning.

20. The power semiconductor module of claim 4, wherein said element control circuits of said control circuit section are mounted, in the form of chips, on said wiring substrate thereof.

21. The power semiconductor module of claim 4, wherein each of said semiconductor element chips is connected through bonding means to a corresponding element control circuit chip, which is mounted on said wiring substrate, so as to transmit signals therebetween.

22. The power semiconductor module of claim 4, wherein input and output terminals of said module are provided as one end portion of a metal plate, the other end portion of which is connected to said connecting conductor of said main circuit section.

23. The power semiconductor module of claim 4, wherein a lowest layer of said wiring substrate is employed as a shield conductor layer for said element control circuits.

24. The power semiconductor module of claim 23, wherein
said wiring conductor of the surface layer of said multi-layer type wiring substrate which is connected to said shield conductor layer is connected through bonding means to a semiconductor element to apply an operating potential thereto, so that said element control circuit is operated on the same potential as said semiconductor element.

\* \* \* \* \*